(12) United States Patent
Dahal et al.

(10) Patent No.: US 11,535,552 B2
(45) Date of Patent: Dec. 27, 2022

(54) CHEMICAL VAPOR DEPOSITION PROCESS FOR DEPOSITING A COATING AND THE COATING FORMED THEREBY

(71) Applicant: PILKINGTON GROUP LIMITED, Lathom (GB)

(72) Inventors: Lila Raj Dahal, Perrysburg, OH (US); David Alan Strickler, Toledo, OH (US)

(73) Assignee: Pilkington Group Limited, Lathom (GB)

(*) Notice: Subject to any disclaimer, the term of this patent is extended or adjusted under 35 U.S.C. 154(b) by 822 days.

(21) Appl. No.: 16/077,810

(22) PCT Filed: Feb. 17, 2017

(86) PCT No.: PCT/GB2017/050424
§ 371 (c)(1),
(2) Date: Aug. 14, 2018

(87) PCT Pub. No.: WO2017/141052
PCT Pub. Date: Aug. 24, 2017

(65) Prior Publication Data
US 2021/0094868 A1  Apr. 1, 2021

Related U.S. Application Data

(60) Provisional application No. 62/296,861, filed on Feb. 18, 2016.

(51) Int. Cl.
| | | |
|---|---|---|
| C23C 16/40 | (2006.01) | |
| C03C 17/245 | (2006.01) | |
| C23C 16/455 | (2006.01) | |
| C23C 16/54 | (2006.01) | |
| C03C 17/34 | (2006.01) | |

(52) U.S. Cl.
CPC ........ C03C 17/2456 (2013.01); C23C 16/402 (2013.01); C23C 16/405 (2013.01); C23C 16/45512 (2013.01); C23C 16/545 (2013.01); *C03C 17/3417* (2013.01); *C03C 2217/23* (2013.01); *C03C 2218/1525* (2013.01); *C23C 16/407* (2013.01)

(58) Field of Classification Search
CPC ................ C23C 16/401; C23C 16/402; C23C 16/45512; C23C 16/545
See application file for complete search history.

(56) References Cited

U.S. PATENT DOCUMENTS 5,536,857 A    7/1996  Narula et al.
2008/0268260 A1* 10/2008  Varaprasad ........... C03C 17/366
                                                        428/429

(Continued)

OTHER PUBLICATIONS

Erik R. Klobukowski et al., "Atmospheric pressure chemical vapor deposition of high silica SiO2—TiO2 antireflection thin films for glass based solar panels," Journal of Materials Chemistry C, vol. 1, No. 39, Jan. 1, 2013, pp. 6188-6190.

(Continued)

*Primary Examiner* — Joseph A Miller, Jr.
(74) *Attorney, Agent, or Firm* — Marshall & Melhorn, LLC

(57) ABSTRACT

A chemical vapor deposition process for depositing a coating comprising silicon oxide and titanium oxide is provided. A coating formed by the chemical vapor deposition process is also provided.

15 Claims, 3 Drawing Sheets

(56) References Cited

U.S. PATENT DOCUMENTS

2010/0285290 A1 11/2010 Lu et al.
2013/0071566 A1 3/2013 Nelson
2015/0246845 A1* 9/2015 Seki .................... C23C 16/401
427/255.18

OTHER PUBLICATIONS

Li-Lan Yang et al., "Compositional tailored sol-gel SiO2—TiO2 thin films: Crystallization, chemical bonding configuration, and optical properties," Journal of Materials Research, vol. 20, No. 11, Nov. 1, 2005, pp. 3141-3149.

* cited by examiner

CHEMICAL VAPOR DEPOSITION PROCESS FOR DEPOSITING A COATING AND THE COATING FORMED THEREBY

BACKGROUND OF THE INVENTION

This invention relates in general to a chemical vapor deposition (CVD) process for depositing a coating. The invention also relates to the coating formed according to the CVD process.

Forming glass articles by depositing coatings on a glass substrate is known. Also, it is known to utilize a color suppression interlayer on a glass substrate to reflect and refract light to interfere with the observance of iridescence. In certain instances, the color suppression interlayer is formed by depositing two coating layers. However, depositing a color suppression interlayer that requires two coating layers adds cost and complexity to forming the glass article. Furthermore, the coating materials known to be utilized in the first coating of a two-layer color suppression interlayer fail to block sodium diffusion from the glass substrate.

Thus, it would be desirable to provide a single layer color suppression interlayer. It would also be desirable if said single layer color suppression interlayer could block sodium diffusion from the glass substrate.

SUMMARY OF THE INVENTION

According to a first aspect of the present invention there is provided a chemical vapor deposition process for depositing a coating, comprising:
providing a glass substrate;
forming a gaseous mixture comprising a silicon-containing compound, an oxygen-containing compound, a radical scavenger, and a titanium-containing compound; and
directing the gaseous mixture toward and along the glass substrate, and reacting the mixture over the glass substrate to form the coating thereover, the coating having a refractive index of 1.48 or more.

Preferably the coating comprises silicon oxide and titanium oxide, with a ratio of titanium to silicon of less than 1.

Preferably the gaseous mixture comprises 0.1 to 5% of the titanium-containing compound by volume. More preferably the gaseous mixture comprises 0.1 to 2% of the titanium-containing compound by volume. Even more preferably the gaseous mixture comprises 0.1 to 1% of the titanium-containing compound by volume.

Preferably the coating is formed directly on the glass substrate.

Preferably the coating is deposited over the glass substrate at essentially atmospheric pressure.

Preferably the silicon oxide is silicon dioxide.

Preferably the titanium oxide is titanium dioxide.

Preferably the coating has a refractive index of 1.50 to 1.85. More preferably the coating has a refractive index of 1.65 to 1.85.

Preferably the glass substrate is moving at the time of forming the coating.

Preferably the glass substrate is a float glass ribbon.

Preferably the coating is formed at a dynamic deposition rate of 280 nm×m/min or more.

Preferably the gaseous mixture is formed prior to being fed through a coating apparatus or within the coating apparatus, the gaseous mixture exiting the coating apparatus and being directed toward and along the glass substrate to form the mixed metal oxide coating.

Preferably the silicon-containing compound is a silane compound. Preferably the silane compound is monosilane or disilane.

Preferably the oxygen-containing compound is molecular oxygen. In the context of the present invention the term "compound" may include compounds and molecules, such as molecular oxygen.

In an alternative embodiment the oxygen-containing compound may be an inorganic oxygen-containing compound. Preferably the inorganic oxygen-containing compound is selected from the group consisting of water, carbon dioxide, nitric oxide, nitrogen dioxide, and nitrous oxide.

Preferably the radical scavenger comprises a hydrocarbon gas. Preferably the hydrocarbon gas is ethylene or propylene. More preferably the hydrocarbon gas is ethylene.

Preferably the titanium-containing compound is an inorganic titanium-containing compound. More preferably the titanium-containing compound is an inorganic, halogenated titanium-containing compound. Most preferably the titanium-containing compound is titanium tetrachloride.

In an alternative embodiment the titanium-containing compound may be an organic titanium-containing compound. In said alternative embodiment the titanium-containing compound is preferably a titanium alkoxide compound. More preferably the titanium-containing compound is titanium isopropoxide or titanium ethoxide.

According to a second aspect of the present invention there is provided a coated glass article comprising a glass substrate and a coating formed over the glass substrate, the coating comprising silicon oxide and titanium oxide, wherein the silicon oxide comprises more than 50 mol % of the coating and the coating has a refractive index of 1.48 or more.

Preferably the coating is formed directly on the glass substrate.

Preferably the coating has a ratio of titanium to silicon of less than one, more preferably less than 0.95, even more preferably less than 0.90. Preferably the coating has a ratio of titanium to silicon of at least 0.01, more preferably at least 0.05, even more preferably at least 0.10.

Preferably the coating has a refractive index of 1.50 or more. More preferably the coating has a refractive index of 1.50 to 1.85. Even more preferably the coating has a refractive index of 1.53 to 1.85. Even more preferably the coating has a refractive index of 1.65 to 1.85.

Preferably the silicon oxide comprises more than 55 mol % of the coating, more preferably more than 60 mol % of the coating.

BRIEF DESCRIPTION OF THE VIEWS OF THE DRAWINGS

The above, as well as other advantages of the process will become readily apparent to those skilled in the art from the following detailed description when considered in the light of the accompanying drawing in which.

DETAILED DESCRIPTION OF THE INVENTION

Figure 1:
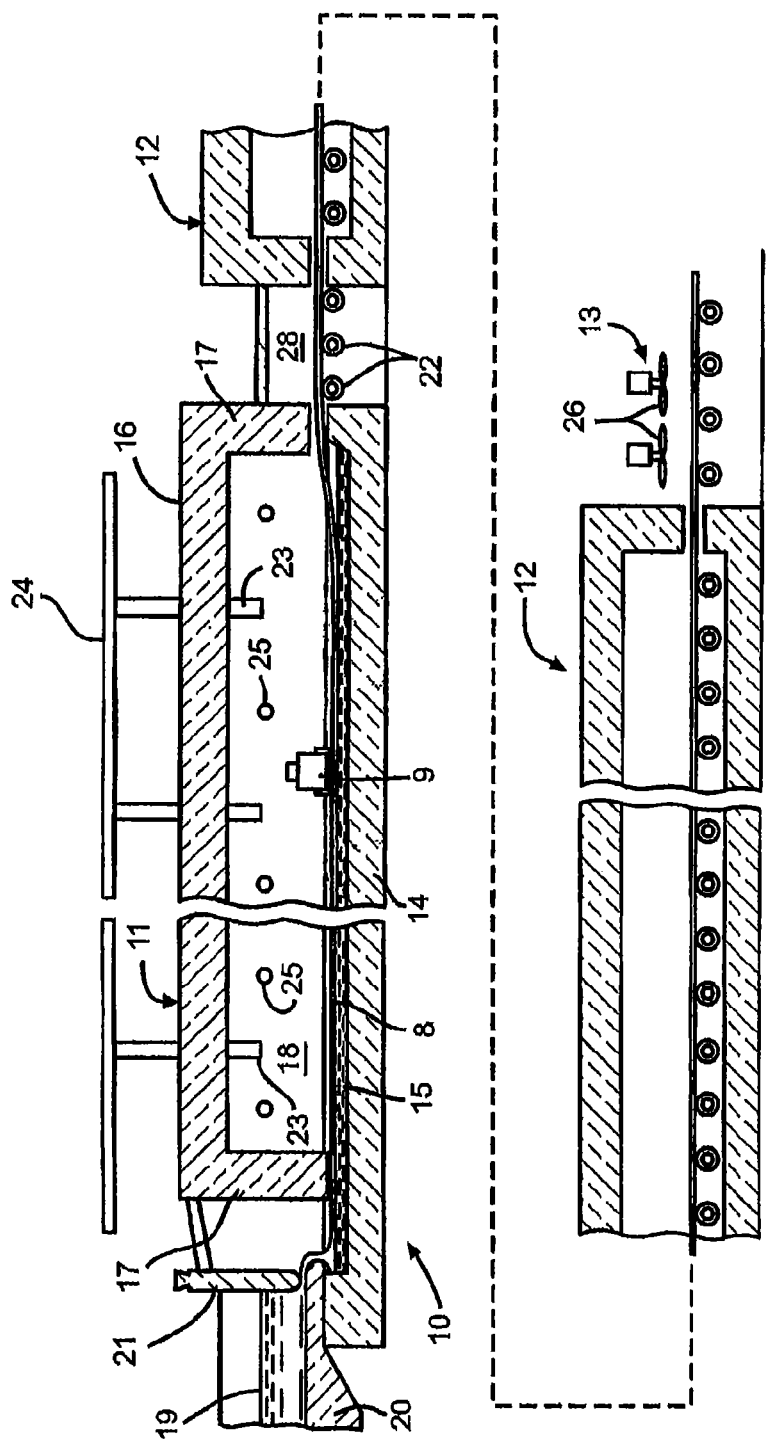
FIG. 1 is a schematic view, in vertical section, of an installation for practicing the float glass manufacturing process in accordance with certain embodiments of the invention.

It is to be understood that the invention may assume various alternative orientations and step sequences, except where expressly specified to the contrary. It is also to be understood that the specific articles, apparatuses and processes described in the following specification are simply exemplary embodiments of the inventive concepts. Hence, specific dimensions, directions, or other physical characteristics relating to the embodiments disclosed are not to be considered as limiting, unless expressly stated otherwise. Also, although they may not be, like elements in the various embodiments described within this section of the application may be commonly referred to with like reference numerals.

In an embodiment, a CVD process for depositing a coating (hereinafter also referred to as the "CVD process") is provided. The CVD process will be described in connection with embodiments of a coated glass article 6, 6A. The embodiments of the coated glass article 6, 6A may be utilized in architectural glazings, electronics, and/or have automotive, aerospace and solar cell applications.

Figure 2:
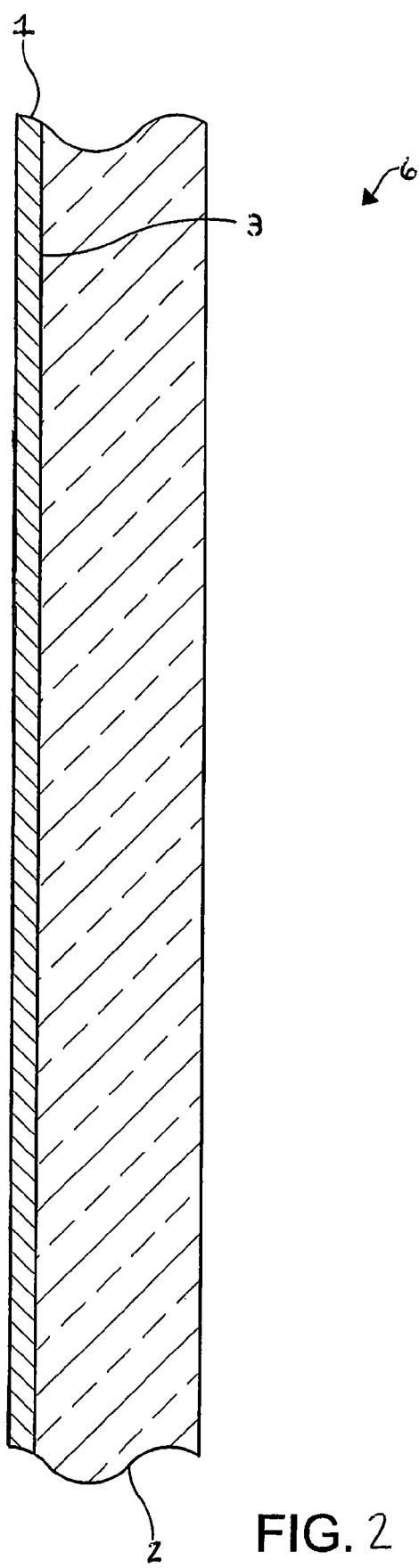
FIG. 2 is a sectional view of a coated glass article in accordance with an embodiment of the invention.
Figure 3:
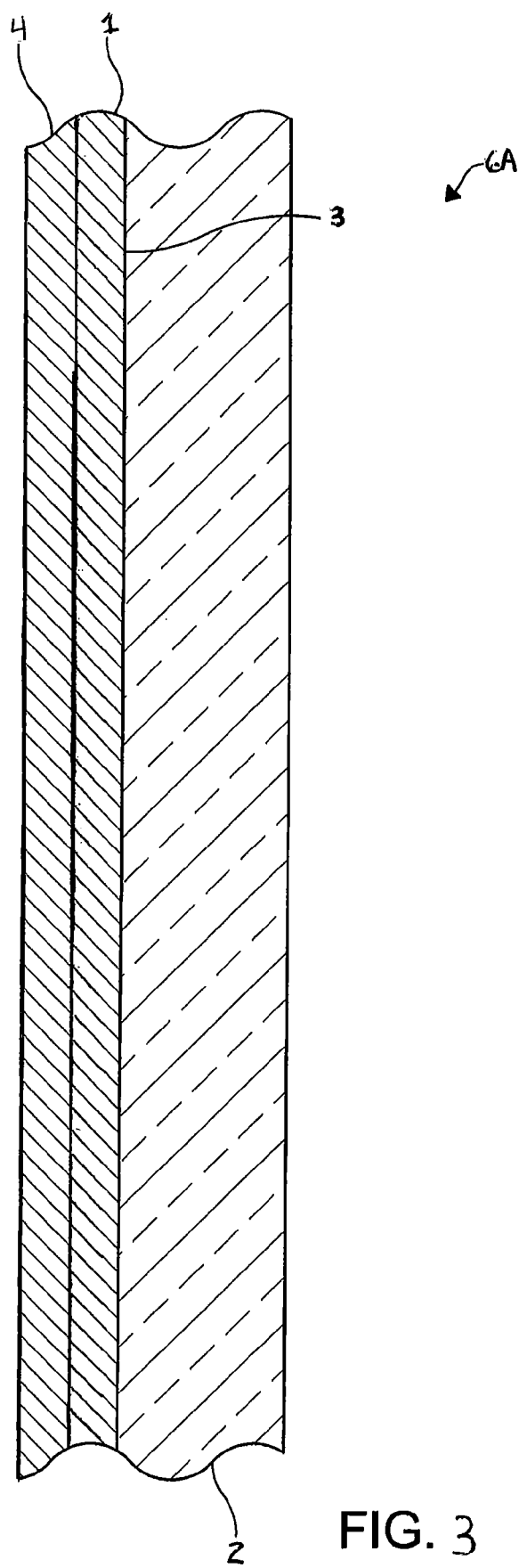
FIG. 3 is a sectional view of a coated glass article in accordance with another embodiment of the invention.

Referring now to FIGS. 2-3, it is preferred that the CVD process is utilized to deposit the coating 1 over a glass substrate 2. However, in certain embodiments, the coating may be deposited over another substrate material. As illustrated, the coating 1 can be formed directly on a deposition surface 3 of the glass substrate 2 without the need to deposit a nucleation coating layer prior to forming the coating. However, it should also be appreciated that the coating can also be deposited over one or more previously deposited coatings if desired.

The coating 1 comprises silicon oxide and titanium oxide, with the ratio of titanium to silicon in the coating being less than one. However, the coating may also contain contaminants of, for example, carbon, chlorine and/or fluorine. Preferably, when the coating contains contaminants, the contaminants are provided in only trace amounts or less.

Preferably, the silicon oxide is silicon dioxide. More preferably, the silicon oxide is stoichiometric silicon dioxide. Silicon dioxide may be referred to as "silica" herein or designated by utilizing the chemical formula $SiO_2$. However, the silicon oxide may be of another suitable stoichiometry. Also, in certain embodiments, the silicon oxide in the coating may be slightly oxygen deficient.

Preferably, the titanium oxide is titanium dioxide. More preferably, the titanium oxide is stoichiometric titanium dioxide. Titanium dioxide may be designated herein by utilizing the chemical formula $TiO_2$. However, the titanium oxide may be of another suitable stoichiometry. Also, in certain embodiments, the titanium oxide in the coating may be slightly oxygen deficient. When the titanium oxide is titanium dioxide, it is preferred that the titanium dioxide is in the anatase form. However, other forms of titanium dioxide may be present in the coating.

A feature of the CVD process is that it allows for the formation of the coating at a commercially viable deposition rate. For example, utilizing the CVD process, the coating may be formed at a deposition rate of 5.0 nanometers per second (nm/sec) or more. Preferably, the coating is formed at a deposition rate of 10.0 nm/sec or more. More preferably, the coating is formed at a deposition rate of 11.5 nm/sec or more. In certain embodiments, the coating is formed at a dynamic deposition rate of 280 nm×m/min or more. In these embodiments, the coating can be formed directly on the deposition surface of a glass substrate. However, it should also be appreciated that the coating can also be formed at the aforementioned deposition rates over one or more previously deposited coatings.

The CVD process also provides additional advantageous features. For example, the CVD process allows for the deposition of a coating layer that can be utilized in a color suppression interlayer. In one such embodiment, the coating is deposited to provide a single layer color suppression interlayer. It should be appreciated that a single layer color suppression interlayer reduces the complexity and the cost required to deposit a color suppression interlayer when compared to an interlayer requiring two coating layers. In this embodiment, the coating is deposited directly on the deposition surface of the glass substrate. In this position, the coating may act as a barrier against sodium diffusion from the glass substrate. Also, in this embodiment, the coating can be deposited so that it has a refractive index of 1.48 or more. It should be appreciated that, if the coating has a refractive index of 1.48 or more, the color suppression interlayer may have improved iridescence interference properties.

The CVD process comprises providing the glass substrate. The glass substrate comprises the deposition surface over which the coating is formed. In an embodiment, the glass substrate is a soda-lime-silica glass. However, the CVD process is not limited to a soda-lime-silica glass substrate as, in other embodiments, the glass substrate may be a borosilicate glass. Additionally, it may be preferable to utilize a glass substrate having a low iron content in practicing the process. Thus, in certain embodiments, the CVD process is not limited to a particular substrate composition.

Further, in certain embodiments, the glass substrate is substantially transparent. However, the invention is not limited to transparent glass substrates as translucent glass substrates may also be utilized in practicing the CVD process. Also, the transparency or absorption characteristics of the substrate may vary between embodiments. Additionally, the CVD process can be practiced utilizing a clear or a colored glass substrate and is not limited to a particular glass substrate thickness.

The CVD process may be carried out in conjunction with the manufacture of the glass substrate. In an embodiment, the glass substrate may be formed utilizing the well-known float glass manufacturing process. An example of a float glass manufacturing process is illustrated in FIG. 1. In this embodiment, the glass substrate may also be referred to as a glass ribbon. However, it should be appreciated that the CVD process can be utilized apart from the float glass manufacturing process or well after formation and cutting of the glass ribbon.

In certain embodiments, the CVD process is a dynamic deposition process. In these embodiments, the glass substrate is moving at the time of forming the coating. Preferably, the glass substrate moves at a predetermined rate of, for example, greater than 3.175 m/min (125 in/min) as the coating is being formed thereon. In an embodiment, the glass substrate is moving at a rate of between 3.175 m/min (125 in/min) and 12.7 m/min (600 in/min) as the coating is being formed.

In certain embodiments, the glass substrate is heated. In an embodiment, the temperature of the glass substrate is about 1100° F. (593° C.) or more when the coating is deposited thereover or thereon. In another embodiment, the temperature of the glass substrate is between about 1100° F. (593° C.) and 1400° F. (760° C.).

Preferably, the coating is deposited over the deposition surface of the glass substrate while the surface is at essentially atmospheric pressure. In this embodiment, the CVD process is an atmospheric pressure CVD (APCVD) process. However, the CVD process is not limited to being an APCVD process as, in other embodiments, the coating may be formed under low-pressure conditions.

The CVD process may comprise providing a source of a silicon-containing compound, a source of one or more oxygen-containing compounds, a source of a radical scavenger, a source of a titanium-containing compound, and a source of one or more inert gases. Preferably, these sources are provided at a location outside the float bath chamber. Separate supply lines may extend from the sources of reactant (precursor) compounds and the one or more carrier gases. As used herein, the phrases "reactant compound" and "precursor compound" may be used interchangeably to refer any or all of the silicon-containing compound, oxygen-containing compound(s), radical scavenger, titanium-containing compound, and/or used to describe the various embodiments thereof disclosed herein.

The CVD process also comprises forming a gaseous mixture. As would be appreciated by those skilled in the art, the precursor compounds suitable for use in the gaseous mixture should be suitable for use in a CVD process. Such compounds may at some point be a liquid or a solid but are volatile such that they can be vaporized for use in the gaseous mixture. In certain embodiments, the gaseous mixture includes precursor compounds suitable for forming the coating at essentially atmospheric pressure. Once in a gaseous state, the precursor compounds can be included in a gaseous stream and utilized in the CVD process to form the coating.

For any particular combination of gaseous precursor compounds, the optimum concentrations and flow rates for achieving a particular deposition rate and coating thickness may vary. However, in order to form a coating as is provided by the CVD process described herein, the gaseous mixture comprises the silicon-containing compound, oxygen-containing compound(s), radical scavenger, and titanium-containing compound.

In an embodiment, the silicon-containing compound is a silane compound. Preferably, the silane compound is monosilane ($SiH_4$). However, other silane compounds are suitable for use in practicing the CVD process. For example, disilane ($Si_2H_6$) is a suitable silane compound for use in the CVD process.

In an embodiment, the oxygen-containing compound may be provided as a part of a gaseous composition such as air. More preferably, oxygen is provided in a substantially purified form. In either embodiment, oxygen is provided in the form of molecular oxygen. In addition to oxygen ($O_2$), other inorganic oxygen-containing compounds may be utilized in practicing the CVD process such as water ($H_2O$), carbon dioxide ($CO_2$), nitric oxide (NO), nitrogen dioxide ($NO_2$), and nitrous oxide ($N_2O$).

Silane compounds may be pyrophoric and when oxygen-containing compounds alone are mixed with a pyrophoric silane compound, silica is produced, but it is produced at unacceptably high rates, resulting in an explosive reaction. Known methods of preventing such a reaction result in the deposition of coatings at very low, commercially impractical rates. Known methods are also limited in the amount of silane and oxygen which can be contained in the gaseous precursor mixture, as too high a concentration results in gas phase reaction of the elements, and no film being produced. Therefore, the gaseous mixture of the CVD process comprises the radical scavenger.

The presence of the radical scavenger allows the silane compound to be mixed with the oxygen-containing compound without undergoing ignition and premature reaction at the operating temperatures. The radical scavenger further provides control of and permits optimization of the kinetics of the reaction above, near, and/or on the glass substrate. In an embodiment, the radical scavenger is a hydrocarbon gas. Preferably, the hydrocarbon gas is ethylene ($C_2H_4$) or propylene ($C_3H_6$), and is most preferably ethylene.

In certain embodiments, the titanium-containing compound is an inorganic titanium-containing compound. Preferably, in these embodiments, the titanium-containing compound is an inorganic, halogenated titanium-containing compound. An example of an inorganic, halogenated titanium-containing compound suitable for use in the forming the gaseous mixture is titanium tetrachloride ($TiCl_4$). Titanium tetrachloride is preferred because it is relatively inexpensive and it does not include carbon, which can become trapped in the coating during formation of the coating. However, the invention is not limited to titanium tetrachloride as other halogenated titanium-containing compounds may be suitable for use in practicing the CVD process.

In other embodiments, the titanium-containing compound is an organic titanium-containing compound. Preferably, in these embodiments, the titanium-containing compound is a titanium alkoxide compound. An example of a titanium alkoxide compound suitable for use in the forming the gaseous mixture is titanium isopropoxide $Ti[OCH(CH_3)_2]_4$. Another example of a titanium alkoxide compound suitable for use in the forming the gaseous mixture is titanium ethoxide $Ti(OEt)_4$. However, the invention is not limited to titanium isopropoxide and titanium ethoxide as other organic titanium-containing compounds may be suitable for use in practicing the CVD process.

The precursor compounds are mixed to form the gaseous mixture. In certain embodiments, the gaseous mixture comprises 0.1-5% by volume of the titanium-containing compound. Preferably, the gaseous mixture comprises 0.1-2% of the titanium-containing compound. More preferably, the gaseous mixture comprises 0.1-1% of the titanium-containing compound.

The precursor compounds are mixed and maintained at a temperature to avoid premature reaction. Those skilled in the art would appreciate that, when premature reaction does occur, undesirable powder may form in the coating apparatus or on the glass substrate. In the embodiments described herein, the CVD process can be operated for an extended period of time without the formation of undesirable powder which further reduces the cost and complexity to produce the coating.

The gaseous mixture may also comprise one or more inert gases utilized as carrier or diluent gas. Suitable inert gases include nitrogen ($N_2$), helium (He) and mixtures thereof. Thus, the CVD process may comprise providing a source of the one or more inert gases from which separate supply lines may extend.

Preferably, the gaseous mixture is delivered to a coating apparatus. In certain embodiments, the gaseous mixture is fed through a coating apparatus prior to forming the coating and discharged from the coating apparatus utilizing one or more gas distributor beams. Descriptions of coating apparatuses suitable for being utilized in the CVD process can be found in published U.S. patent application no. 2012/0240627 and U.S. Pat. No. 4,922,853, the entire disclosures of which are hereby incorporated by reference.

Preferably, the gaseous mixture is formed prior to being fed through the coating apparatus. For example, the precursor compounds may be mixed in a feed line connected to an inlet of the coating apparatus. In other embodiments, the gaseous mixture may be formed within the coating apparatus. The gaseous mixture is directed toward and along the glass substrate. Utilizing a coating apparatus aids in directing the gaseous mixture toward and along the glass substrate. Preferably, the gaseous mixture is directed toward and along the glass substrate in a laminar flow.

Preferably, the coating apparatus extends transversely across the glass substrate and is provided at a predetermined distance thereabove. The coating apparatus is preferably located at a predetermined location. When the CVD process is utilized in conjunction with the float glass manufacturing process, the coating apparatus is preferably provided within the float bath section thereof. However, the coating apparatus may be provided in the annealing lehr or in the gap between the float bath and the annealing lehr.

The gaseous mixture reacts at or near the deposition surface of the glass substrate to form the coating thereover. The CVD process results in the deposition of a high quality coating on the glass substrate. In particular, the coating formed using the CVD process exhibits excellent coating thickness uniformity. In an embodiment, the coating is a pyrolytic coating.

By providing a coating which comprises silicon oxide and titanium oxide, the coating has a refractive index which is higher than the refractive index of a coating containing only silicon oxide. Providing the coating with a refractive index as described allows the coating to be utilized as a single layer color suppression interlayer when the coating is used in, for example, combination with other coating layers or a particular application like an architectural glazing. As noted above, the coating has a refractive index of 1.48 or more. In certain embodiments, the coating has a refractive index of 1.50 or more. In other embodiments, the coating has a refractive index of 1.65 or more.

The refractive index can be selected by providing a desired ratio of titanium oxide to silicon oxide in the coating. In such embodiments, the refractive index of the coating may be 1.48-1.85. Preferably, in these embodiments, the refractive index of the coating is 1.50-1.85. In other embodiments, the refractive index of the coating is 1.65-1.85.

As discussed above and as shown in FIGS. 2-3, in certain embodiments, the coating 1 is formed directly on the glass substrate 2. In these embodiments, the glass substrate 2 is uncoated at the time of depositing the coating 1. Thus, there are no other coating layers that separate the coating 1 from the deposition surface 3 of the glass substrate 2. Additionally, as illustrated in FIG. 3, the CVD process described herein may be utilized in combination with one or more additional coating layers 4 formed over the coating 1 to achieve a desired coating stack. In an embodiment, the one or more additional coating layers 4 comprises a layer of fluorine doped tin oxide ($SnO_2$:F). The additional coating layers 4 may be formed in conjunction with the float glass manufacturing process shortly after forming the coating 1 or as part of another manufacturing process. Also, these additional coating layers may be formed by pyrolysis or by another coating deposition process, and/or by utilizing one or more additional coating apparatuses.

As discussed, above, the CVD process may be carried out in conjunction with the manufacture of the glass substrate in the well-known float glass manufacturing process. The float glass manufacturing process is typically carried out utilizing a float glass installation such as the installation 10 depicted in the FIG. 1. However, it should be understood that the float glass installation 10 described herein is only illustrative of such installations.

As illustrated in the FIG. 1, the float glass installation 10 may comprise a canal section 20 along which molten glass 19 is delivered from a melting furnace, to a float bath section 11 wherein the glass substrate is formed. In this embodiment, the glass substrate will be referred to as a glass ribbon 8. The glass ribbon 8 is a preferable substrate on which the coating is deposited. However, it should be appreciated that the glass substrate is not limited to being a glass ribbon.

The glass ribbon 8 advances from the bath section 11 through an adjacent annealing lehr 12 and a cooling section 13. The float bath section 11 includes: a bottom section 14 within which a bath of molten tin 15 is contained, a roof 16, opposite side walls (not depicted) and end walls 17. The roof 16, side walls and end walls 17 together define an enclosure 18 in which a non-oxidizing atmosphere is maintained to prevent oxidation of the molten tin 15.

In operation, the molten glass 19 flows along the canal 20 beneath a regulating tweel 21 and downwardly onto the surface of the tin bath 15 in controlled amounts. On the molten tin surface, the molten glass 19 spreads laterally under the influence of gravity and surface tension, as well as certain mechanical influences, and it is advanced across the tin bath 15 to form the glass ribbon 8. The glass ribbon 8 is removed from the bath section 11 over lift out rolls 22 and is thereafter conveyed through the annealing lehr 12 and the cooling section 13 on aligned rolls. The deposition of the coating preferably takes place in the float bath section 11, although it may be possible for deposition to take place further along the glass production line, for example, in the gap 28 between the float bath 11 and the annealing lehr 12, or in the annealing lehr 12. Also, as illustrated in the FIG. 1, the coating apparatus 9 is shown within the float bath section 11. The coating may be formed utilizing one coating apparatus 9 or a plurality of coating apparatuses.

A suitable non-oxidizing atmosphere, generally nitrogen or a mixture of nitrogen and hydrogen in which nitrogen predominates, is maintained in the float bath section 11 to prevent oxidation of the molten tin 15 comprising the float bath. The glass ribbon is surrounded by float bath atmosphere. The atmosphere gas is admitted through conduits 23 operably coupled to a distribution manifold 24. The non-oxidizing gas is introduced at a rate sufficient to compensate for normal losses and maintain a slight positive pressure, on the order of between about 0.001 and about 0.01 atmosphere above ambient atmospheric pressure, so as to prevent infiltration of outside atmosphere. For purposes of the describing the invention, the above-noted pressure range is considered to constitute normal atmospheric pressure.

The coating is preferably formed at essentially atmospheric pressure. Thus, the pressure of the float bath section 11, annealing lehr 12, and/or in the gap 28 between the float bath 11 and the annealing lehr 12 may be essentially atmospheric pressure.

Heat for maintaining the desired temperature regime in the float bath section 11 and the enclosure 18 is provided by radiant heaters 25 within the enclosure 18. The atmosphere within the lehr 12 is typically atmospheric air, as the cooling section 13 is not enclosed and the glass ribbon 8 is therefore open to the ambient atmosphere. The glass ribbon 8 is subsequently allowed to cool to ambient temperature. To cool the glass ribbon 8, ambient air may be directed against the glass ribbon 8 as by fans 26 in the cooling section 13. Heaters (not depicted) may also be provided within the annealing lehr 12 for causing the temperature of the glass ribbon 8 to be gradually reduced in accordance with a predetermined regime as it is conveyed therethrough.

EXAMPLES

The following examples are presented solely for the purpose of further illustrating and disclosing the embodiments of the CVD process.

Examples of the CVD process within the scope of the invention are described below and illustrated in TABLE 1. In TABLE 1, the coated glass articles within the scope of the invention are Ex 1-Ex 6. Comparative examples, not considered to be a part of the invention, are also described below and illustrated in TABLE 1. In TABLE 1, the comparative examples are designated as C1-C5.

A soda-lime-silica glass substrate was utilized in examples Ex1-Ex6 and C1-C5. The glass substrate utilized in each of Ex 1-Ex 6 and C1-C5 was moving when the coating was deposited thereon. The deposition surface of the glass substrate was at essentially atmospheric pressure when each coating was deposited.

A gaseous mixture comprising certain precursor compounds was formed for each of Ex 1-Ex6 and C1-C5. For Ex-1-Ex6 and C2-C5, the gaseous mixtures comprised monosilane, ethylene, oxygen, and titanium tetrachloride. For C1, the gaseous mixture comprised monosilane, ethylene and oxygen. The percentage by volume of each precursor compound in the gaseous mixtures of Ex 1-Ex 6 and C1-C5 are as listed in TABLE 1. The gaseous mixtures utilized for Ex 1-Ex 6 and C1-C5 also comprised inert gases. The line speed for each of Ex 1-Ex 6 and C1-C5, i.e. the speed of the glass substrate moving beneath the coating apparatus from which the gaseous precursor compounds were delivered, was 5.08 meters per minute (m/min).

The deposition surface of the glass substrate was uncoated when each coating was deposited. Thus, the coatings of Ex 1-Ex 6 and C1-C5 were deposited directly on the glass substrate. The resulting coated glass articles of Ex 1-Ex 6 and C2-C5 are of a glass/silicon oxide-titanium oxide arrangement. The resulting coated glass article of C1 is of a glass/silica arrangement.

The thickness of each coating deposited according to Ex 1-Ex 6 and C1-C5 is reported in TABLE 1. The coating thicknesses reported in TABLE 1 were determined using optical modeling. Also, the dynamic deposition rate (DDR) of each coating is reported in TABLE 1. It should be appreciated that DDR refers to the thickness of the coating in nanometers (nm) multiplied by the line speed in meters per minute (m/min). The DDR is useful for comparing coating deposition rates at different line speeds. Additionally, the deposition rate of each coating is reported in TABLE 1. The refractive index (RI) of each coating at 550 nanometers (nm) deposited according to Ex 1-Ex 6 and C1-C5 is also listed in Table 1. The refractive indices were calculated by optical modeling.

As illustrated by Ex 1-Ex 6, when a sufficient amount of a titanium-containing compound is utilized in a gaseous mixture which also comprises a silicon-containing compound such as monosilane, a radical scavenger such as ethylene, and an oxygen-containing compound such as oxygen, a coating comprising silicon oxide and titanium oxide can be deposited on a glass substrate.

For Ex 1, Ex 4, Ex 6, and C1, x-ray photoemission spectroscopy was performed on the samples. The results showed that the ratio of titanium to silicon in the respective coatings was 0.16 for Ex 1, 0.48 for Ex 4, 0.83 for Ex 6, and 0 for C1. Thus, the coatings of the invention comprise primarily silicon oxide, the ratio of titanium to silicon being less than one.

In all of the embodiments illustrated by Ex 1-Ex 6, the coating was formed at a deposition rate of 5.0 nm/sec or more. In fact, the coatings of Ex 1-Ex 6 were all formed at deposition rates of more than 11.5 nm/sec. Also, the coatings of Ex 1-Ex 6 were all formed at a DDR of 275 nm×m/min or more. Additionally, as shown in TABLE 1, the coatings of Ex 1-Ex 6 have refractive indices which are higher than the refractive index of the silica coating of C1. Moreover, the coatings of Ex 1-Ex 6 all exhibited refractive indices of 1.50 or more.

The foregoing description is considered as illustrative only of the principles of the invention. Further, since numerous modifications and changes will readily occur to those skilled in the art, it is not desired to limit the invention to the exact construction and processes shown and described herein. Accordingly, all suitable modifications and equivalents may be considered as falling within the scope of the invention as defined by the claims which follow.

The invention claimed is:

1. A chemical vapor deposition process for depositing a coating, comprising:
   providing a glass substrate;
   forming a gaseous mixture comprising a silicon-containing compound, an oxygen-containing compound, a radical scavenger, and a titanium-containing compound;
   feeding the gaseous mixture through a coating apparatus prior to forming the coating; and
   discharging the gaseous mixture from the coating apparatus, directing the gaseous mixture toward and along the glass substrate, and reacting the mixture over the glass substrate to form the coating thereover, the coating having a refractive index of 1.48 or more;
   wherein the gaseous mixture comprises 0.1 to 5% of the titanium-containing compound by volume.

TABLE 1

| Comparative Example and Examples | % $TiCl_4$ | % $SiH_4$ | % $C_2H_4$ | % $O_2$ | Thickness (nm) | Deposition rate (nm/sec) | DDR (nm * m/min) | RI @ 550 nm |
|---|---|---|---|---|---|---|---|---|
| C1 | 0 | 1.0 | 6.0 | 4.0 | 52.3 | 11.2 | 266 | 1.463 |
| C2 | 0.02 | 1.0 | 6.0 | 4.0 | 61.4 | 13.2 | 312 | 1.478 |
| C3 | 0.04 | 1.0 | 6.0 | 4.0 | 58.1 | 12.5 | 295 | 1.428 |
| C4 | 0.06 | 1.0 | 6.0 | 4.0 | 57.2 | 12.3 | 291 | 1.452 |
| C5 | 0.08 | 1.0 | 6.0 | 4.0 | 54.2 | 11.7 | 275 | 1.456 |
| Ex 1 | 0.1 | 1.0 | 6.0 | 4.0 | 55.4 | 11.9 | 281 | 1.509 |
| Ex 2 | 0.2 | 1.0 | 6.0 | 4.0 | 65.0 | 14.0 | 330 | 1.510 |
| Ex 3 | 0.3 | 1.0 | 6.0 | 4.0 | 64.9 | 14.0 | 330 | 1.500 |
| Ex 4 | 0.4 | 1.0 | 6.0 | 4.0 | 57.5 | 12.4 | 292 | 1.536 |
| Ex 5 | 0.5 | 1.0 | 6.0 | 4.0 | 57.4 | 12.3 | 292 | 1.531 |
| Ex 6 | 1.0 | 1.0 | 6.0 | 4.0 | 66.7 | 14.3 | 339 | 1.645 |

2. The chemical vapor deposition process of claim 1, wherein the coating comprises silicon oxide and titanium oxide, with a ratio of titanium to silicon of less than 1.

3. The chemical vapor deposition process of claim 1, wherein the coating is formed directly on the glass substrate.

4. The chemical vapor deposition process of claim 2, wherein the silicon oxide is silicon dioxide.

5. The chemical vapor deposition process of claim 2, wherein the titanium oxide is titanium dioxide.

6. The chemical vapor deposition process of claim 1, wherein the coating has a refractive index of 1.50 to 1.85.

7. The chemical vapor deposition process of claim 1, wherein the glass substrate is moving at the time of forming the coating, or wherein the glass substrate is a float glass ribbon.

8. The chemical vapor deposition process of claim 1, wherein the coating is formed at a dynamic deposition rate of 280 nm×m/min or more.

9. The chemical vapor deposition process of claim 1, wherein the gaseous mixture is formed prior to being fed through the coating apparatus or within the coating apparatus.

10. The chemical vapor deposition process of claim 1, wherein the silicon-containing compound is a silane compound.

11. The chemical vapor deposition process of claim 1, wherein the oxygen-containing compound is molecular oxygen.

12. The chemical vapor deposition process of claim 1, wherein the oxygen-containing compound is an inorganic oxygen-containing compound.

13. The chemical vapor deposition process of claim 1, wherein the radical scavenger is ethylene or propylene.

14. The chemical vapor deposition process of claim 1, wherein the titanium-containing compound is an inorganic titanium-containing compound.

15. The chemical vapor deposition process of claim 1, wherein the titanium-containing compound is an organic titanium-containing compound.

\* \* \* \* \*